(12) United States Patent
Yang

(10) Patent No.: US 6,734,689 B1
(45) Date of Patent: May 11, 2004

(54) MEASUREMENT PROBE PROVIDING SIGNAL CONTROL FOR AN EOS/ESD PROTECTION MODULE

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/313,753

(22) Filed: Dec. 5, 2002

(51) Int. Cl.⁷ .............................................. G01R 31/02
(52) U.S. Cl. ...................................... 324/754; 324/761
(58) Field of Search ........................ 324/754, 760–761, 324/538–539, 95, 72.5; 200/61.76; 439/482, 488, 578–585

(56) References Cited

U.S. PATENT DOCUMENTS

| | | | |
|---|---|---|---|
| 4,039,976 A | * 8/1977 | Prochazka | ................... 324/95 |
| 5,157,337 A | 10/1992 | Neel et al. | |
| 5,232,377 A | 8/1993 | Leibfried, Jr. | |
| 5,233,290 A | * 8/1993 | Swart | ......................... 324/761 |
| 5,455,515 A | * 10/1995 | Saijo et al. | ................... 324/761 |
| 5,604,440 A | * 2/1997 | Tomikawa et al. | .......... 324/761 |
| 6,183,297 B1 | * 2/2001 | Kay et al. | .................... 439/578 |
| 6,281,690 B1 | 8/2001 | Frey | |
| 6,498,506 B1 | * 12/2002 | Beckous | ..................... 324/761 |

* cited by examiner

Primary Examiner—Evan Pert
Assistant Examiner—Jermele M. Hollington
(74) Attorney, Agent, or Firm—William K. Bucher

(57) ABSTRACT

A measurement probe has housing in which are disposed a spring loaded coaxial probe assembly and a pressure sensor. The probe assembly is formed from a semi-rigid coaxial cable having a probing tip formed at one end and a coaxial connector at the other end. The pressure sensor has first electrically conductive contact secured and electrically coupled to the semi-rigid coaxial cable and a second electrically conductive contact positioned and secured within the internal cavity of the housing. The probing tip is coupled to electrical ground via a control module when the housing is in a first position and the probing tip is coupled to the input circuitry of the measurement test instrument via the control module in response to an activation signal generated by the pressure sensor in response to movement of the housing to a second position and coupled to the control module.

19 Claims, 11 Drawing Sheets

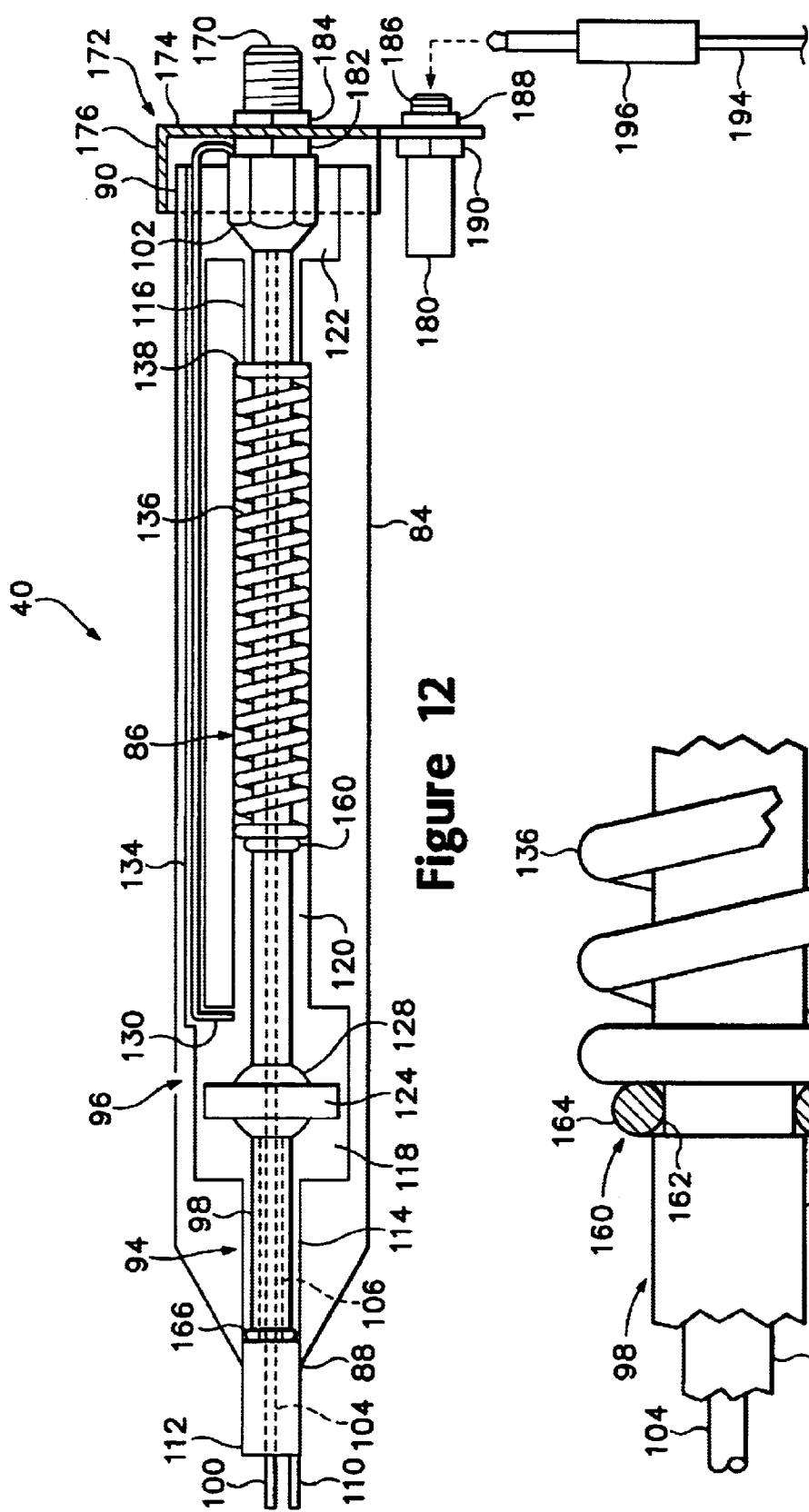

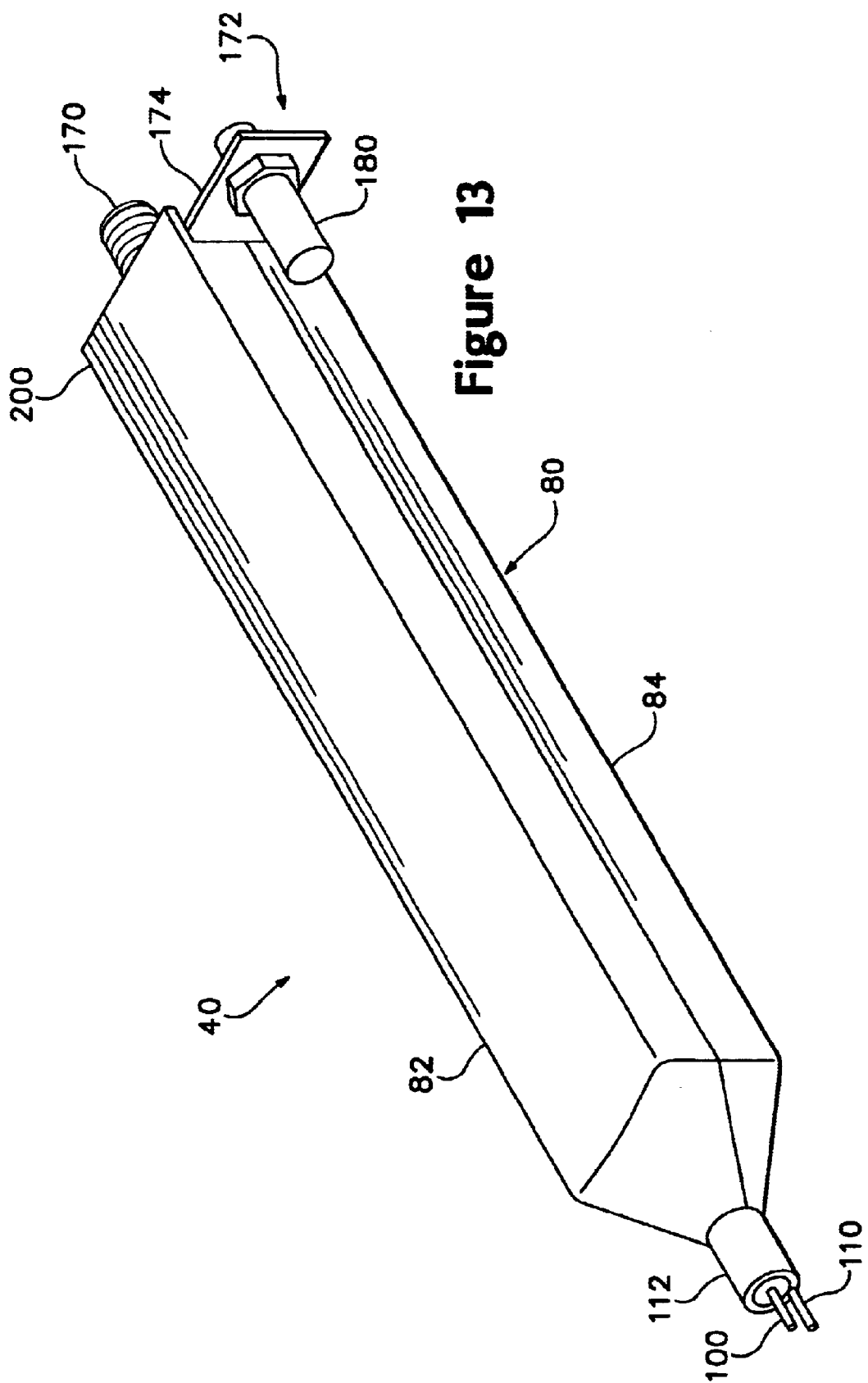

MEASUREMENT PROBE PROVIDING SIGNAL CONTROL FOR AN EOS/ESD PROTECTION MODULE

BACKGROUND OF THE INVENTION

The present invention related generally to measurement probes and more particularly to a high frequency measurement probe providing signal control for an electrical over stress (EOS) and electrostatic discharge (ESD) protection module.

Ultra high speed sampling heads used in time domain reflectometry typically dictate extremely low parasitic capacitances. This introduces unique problems. Sampling devices are much more sensitive to static charges residing on a device under test before a test probe touches it. The small geometry of the sampling diodes in the sampling heads often dictate low breakdown voltages. The low parasitic capacitance at the sampling head input means that for a given device under test (DUT) static charge, there will be a higher transient voltage at the sampler input because of the reduced charge sharing effect. It is therefore important to neutralize any static charge on the device under test before the sampling head input is coupled to the device under test.

Conventionally, users are advised to take all anti-static precautions including purchasing and installing antistatic equipment and employing anti-static procedures. Such equipment and procedures include using ionized airflow devices to reduce the DUT static charge on isolated conductors, ground straps on the test bench and the operator, and an anti-static mat around the test bench. Another piece of anti-static equipment that may be used with sampling heads is the SIU600 Static Isolation Unit, manufactured and sold by Tektronix, Inc., Beaverton, Oregon or the Model 1201 Static Isolation Unit, manufactured and sold by Picosecond ATE, Inc. Beaverton, Oreg. Referring to FIG. 1, there is representatively shown the static isolation unit 10 that includes an interface box 12, foot pedal 14, and a power adapter 16. The power adapter 16 is connected to a standard electrical outlet to provide DC power to circuitry within the interface box 12. An RF probe 18 for probing a device under test 20, such as circuit runs 22 on a circuit board 24, is connected to the interface box 12. A coaxial cable 26 couples the interface box 12 to a TDR sampling head 28 mounted in a sampling oscilloscope 30. The foot pedal 14 is connected to the interface box 12 for coupling the output of the device under test 20 through the interface box 12 to the sampling head 28. When the foot pedal 14 is in the normal position (not pressed), the input of a buffer circuit is coupled to a TTL logic high that cuts off current flow in a drive circuit to an RF relay in the interface box 12. The normally open RF relay coupled the probing tip of the RF probe 18 to electrical ground through a 50Ω termination resistor 32. Positioning the probing tip of the RF probe 18 on the DUT 20 discharges any static charge stored in the DUT 20. Pressing the foot pedal 14 closes a low resistance switch and allies a TTL active low signal to the buffer circuit that activates drive circuitry in the interface box 12 that energizes the relay and connects the probing tip of the RF probe 18 to the sampling head input, allowing a measurement to be made. The circuitry in the interface box 12 operates under TTL active low logic allowing the foot pedal 14 to be replaced with a TTL external source. The use of TTL active low logic requiring the use of a low resistance switch in the foot pedal 14 for proper operation of the interface box 12 circuitry.

Proper use of the static isolation unit 10 prevents ESD and electrical over stress (EOS) static charge from damaging or destroying the sampling head. The main difference between ESD and EOS is that EOS can occur at a much lower voltage level that ESD. ESD static voltages are typically several hundred to several thousand volts, whereas EOS static voltages may be as low as 15 to 30 volts. The sampling diodes in the sampling head has a breakdown voltage of approximately 9 volts. EOS static discharge causes microscopic damage to the semiconductor layer of the sampling diodes in the sampling head providing a leakage current path around the semiconductor Schottky junction. Over time, the incremental damage of each occurrence of the EOS static discharge continues to degrade the performance of the semiconductor device until the leakage current causes excessive measurement error.

In TDR measurements of a device under test, an operator places the RF probe on the test point with operator's foot off of the foot pedal 14. The probing tip of the RF probe is coupled to electrical ground through the interface box. Once the operator has properly placed the probe on the test point, the operator depresses the foot pedal with his or her foot and circuitry in the interface box couples the probing tip of the RF probe to the sampling head circuitry. After the measurement is made, the operator removes his or her foot from the foot pedal before removing the RF probe from the test point to disconnect the probe from the sampling head and reconnect the probe to electrical ground. However, in a production environment where repetitive probing is done by the operator, an operator may accidentally keep the foot pedal 14 depressed while repositioning the probe or moving the probe from one test point to another. This allows ESD and EOS voltages on the device under test to be coupled to the sampling head causing damage to the sampling diodes.

One solution is to move the low resistance switch in the foot pedal into the RF probe 18. This would result in a bulkier probe design requiring the placement low resistance switch in the probe along with a hand operated mechanical actuator to allow an operator to activate the switch for measurements. Such a design does not eliminate the possibility of an operator inadvertently keeping the low resistance switch closed while moving from one test point to another.

What is needed is a fail-safe electrostatic discharge and electrical over stress static discharge solution that prevents electrostatic discharges and electrical over stress static discharges from a sampling head input. Activation of the EOS and ESD protection should be incorporated into the measurement probe thus eliminating the need for a foot pedal. The measurement probe should automatically provide EOS and ESD protection for and signal connectivity to sampling head through the ordinary use of the probe for making measurement.

SUMMARY OF THE INVENTION

Accordingly, the present invention is a measurement probe providing signal control to an electrical over stress and electrostatic discharge protection module for coupling the measurement probe to input circuitry of the measurement test instrument. The measurement probe has a spring loaded coaxial probe assembly formed from a semi-rigid coaxial cable. The semi-rigid coaxial cable has a probing tip at one end and a threaded connector at the-other end for receiving a coaxial cable coupled to the electrical over stress and electrostatic discharge protection module. A compression spring is positioned on the semi-rigid coaxial cable for biasing the spring loaded coaxial probe assembly. A housing having an internal cavity extends the length of the housing and is exposed at opposing ends of the housing. The spring loaded coaxial probe assembly is disposed within the internal cavity with the probing tip extending from one end of the housing and the threaded connector extending from the other end of the housing. The housing is movable from a first position to a second position relative to the spring loaded coaxial probe assembly from pressure applied to the probing tip of the measurement probe in contact with a device under test. A pressure sensor has a first electrically conductive contact secured and electrically coupled to an outer shielding conductor of the semi-rigid coaxial cable and a second electrically conductive contact positioned and secured within the internal cavity of the housing The second electrically conductive contact is coupled to the control module via an electrical conductor. The probing tip is coupled to electrical ground via the control module when the housing is in the first position. The probing tip is coupled via the control module to the input circuitry of the measurement test instrument when the housing is in the second position. The control module is responsive to an activation signal generated by the first and second electrically conductive contacts of the pressure sensor contacting each other by movement of the housing to the second position.

The housing has first and second members with each member having a channel formed therein for receiving the spring loaded coaxial probe assembly and the pressure sensor. The channels form the internal cavity when the first and second members are joined together. The first and second electrically conductive contacts of the pressure sensor are disposed in a pressure sensor chamber that is a part of the internal cavity. The housing is preferably formed with an electrical conductor channel with one end of the electrical conductor channel extending to a pressure sensor and the other end extending to the threaded connector end of the housing for receiving the electrical conductor.

The first electrically conductive contact of the pressure sensor may be formed of a rectangular block of electrically conductive material having a bore formed therethrough for receiving the semi-rigid coaxial cable. The first electrically conductive contact may also be formed as a disk of electrically conductive material having a bore formed therethrough for receiving the semi-rigid coaxial cable. The second electrically conductive contact of the pressure sensor may be formed of a block of electrically conductive material having the electrical conductor coupled thereto. The second electrically conductive contact may also be formed of a flat conductor having a first portion exposed in the pressure sensor cavity and a second portion disposed within the electrical conductor channel. The second electrically conductive contact may further be formed as a fiat electrically conductive disk positioned in notches formed in the pressure sensor chamber. The flat electrically conductive disk as an oversized bore therethrough that allows for the free movement of the semi-rigid coaxial cable through flat electrically conductive disk. The second electrically conductive contact may further have a bore therethrough for closely receiving an insulating bushing. One end of the second electrically conductive contact extends past one end of the insulating bushing and the other end abuts an outwardly extending flange formed at the other end of the insulating bushing. The insulating bushing has an oversized bore formed therethrough that allows for the free movement of the semi-rigid coaxial cable through the bushing. The flange of the insulating bushing is secured to the housing.

The electrical conductor is preferably an insulated electrical wire. The insulation on the end portion of the insulated electrical wire may be removed to expose the electrical wire with the end of the exposed wire extending into the pressure sensor chamber to form the second electrically conductive contact of the pressure sensor. The electrical conductor may consist of first and second insulated wire segments. The first wire segment electrically couples the second electrically conductive contact of the pressure sensor to an electrical contact of an electrical connector receptacle mounted on the measurement probe. The second insulated wire segment electrically couples an electrical contact of a first electrical plug to an electrical contact of a second electrical plug. The first electrical plug mates with the electrical connector receptacle mounted on the measurement probe and the second electrical plug mates with an electrical connector receptacle having at least a first electrical contact mounted in the control module.

One end of the compression spring may abut the first electrically conductive contact of the pressure sensor with and the other end of the pressure spring abutting a shoulder extending into the interior cavity. The compression spring may also abut a spring retention member secured to the semi-rigid coaxial cable with the other end abutting the shoulder extending into the interior cavity. The spring retention member has transverse notch formed in the outer shielding conductor of the semi-rigid coaxial cable with a wire wrapped around the semi-rigid coaxial cable in an overlapping manner and engaging the transverse notch. The overlapping portion of the wire is soldered together to secure the compression spring retention member to the semi-rigid coaxial cable.

The objects, advantages and novel features of the present invention are apparent from the following detailed description when read in conjunction with appended claims and attached drawings.

BRIEF DESCRIPTION OF THE DRAWINGS

FIG. 11 is a plan view of the compression spring retention member in the measurement probe providing EOS/ESD signal control according to the present invention.

FIG. 12 is a plan view showing the elements of the second embodiment of the measurement probe providing EOS/ESD signal control according to the present invention.

FIG. 13 is a perspective view of an alternative structure for the housing of the measurement probe providing EOS/ESD signal control according to the present invention.

DETAILED DESCRIPTION OF THE PREFERRED EMBODIMENT

Figure 1:
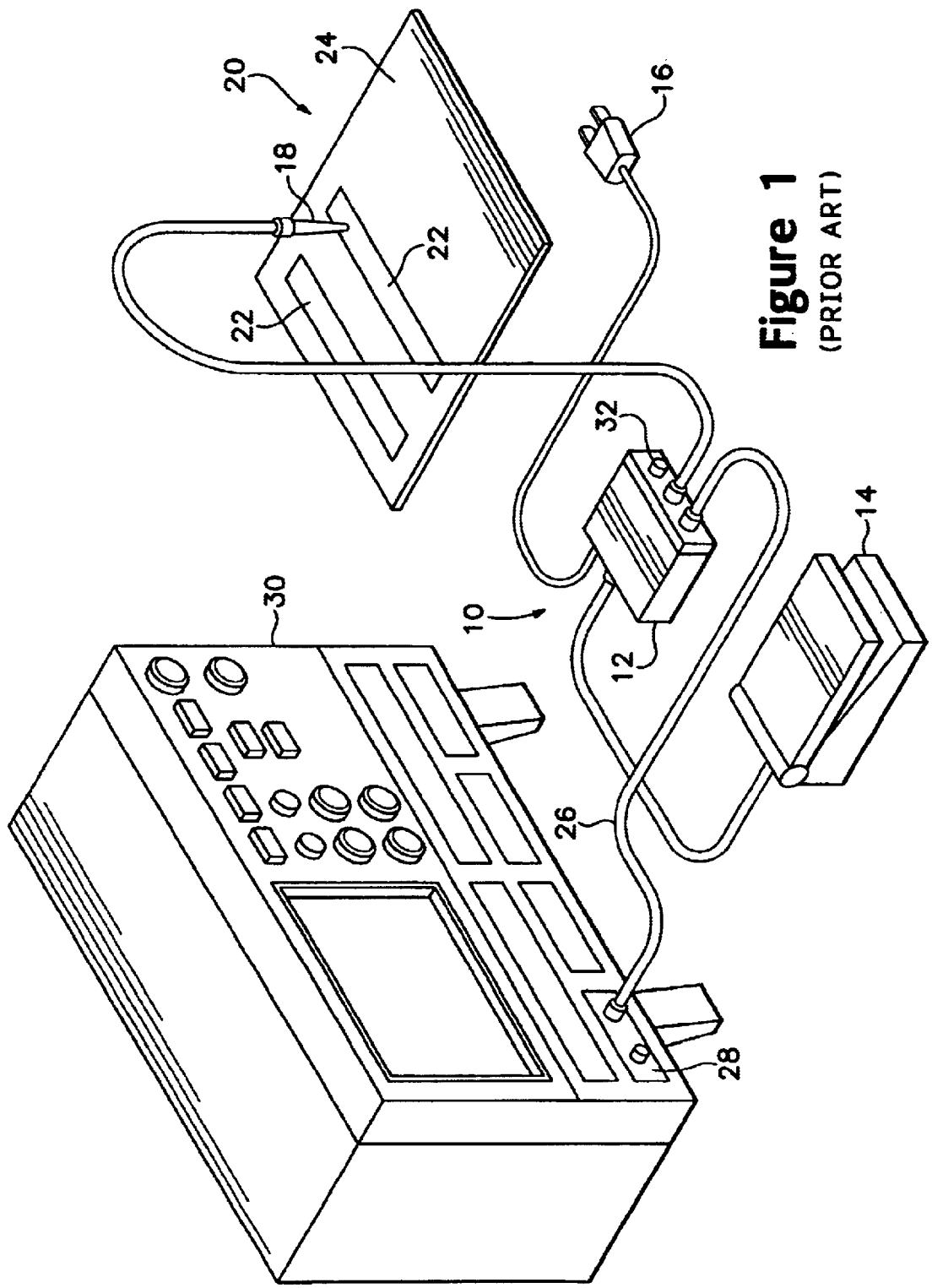
FIG. 1 is a representative perspective view of a static isolation unit for a measurement probe used with a measurement test instrument.
Figure 2:
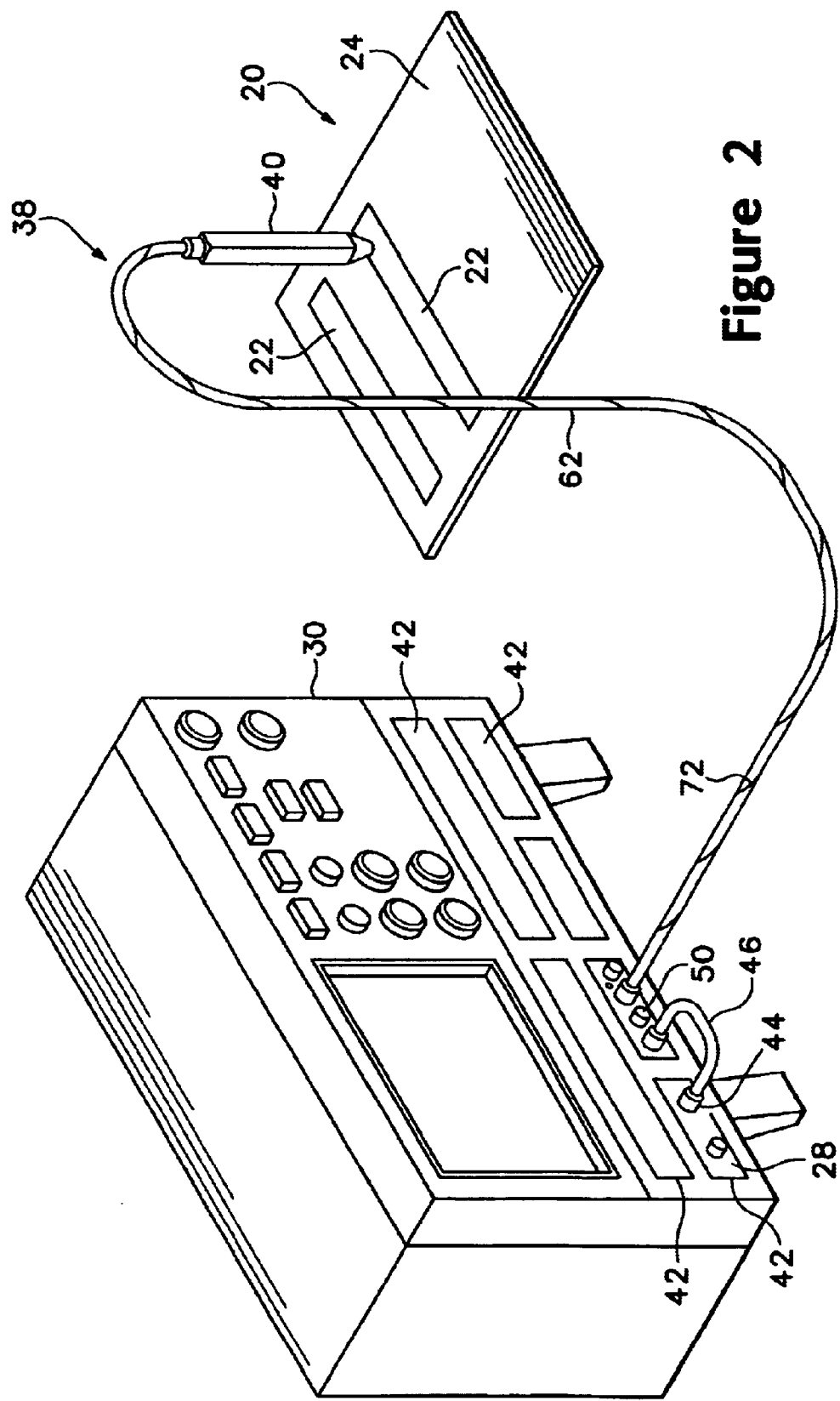
FIG. 2 is a perspective view of a measurement probe providing signal control for an EOS/ESD protection module according to the present invention.
Figure 3:
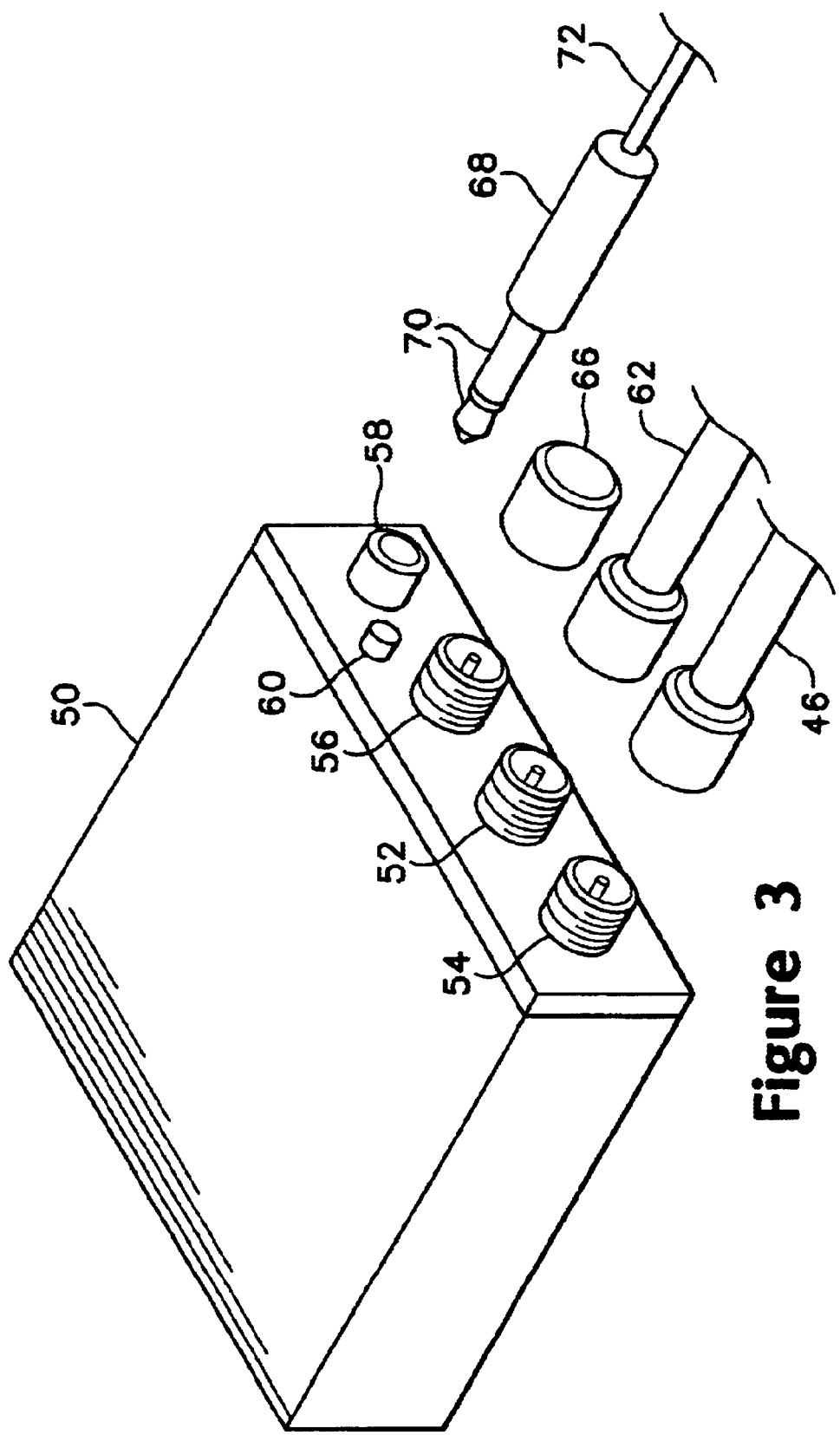
FIG. 3 is a perspective view of the EOS/ESD protection control module coupled to the measurement probe providing signal control according to the present invention.

Referring to FIG. 2, there is shown a representative view of the measurement probe 40 having signal control for an electrical over stress (EOS) and electrostatic discharge (ESD) control module 50. Like elements from the previous drawing are labeled the same. The measurement test instrument 30 is preferably a sampling oscilloscope, such as the TDS8000 Sampling Oscilloscope, manufactured and sold by Tektronix, Inc., Beaverton, Oreg. The sampling oscilloscope 30 has a modular architecture that includes multiple bays 42 for receiving various types of optical and electrical plug-in modules 28. The bays 42 provide power, control signals and signal output for the modules. One such module is the 80E04 TDR Sampling Head that is usable for making TDR measurements. The sampling head 28 has an input terminal 44 coupled to sampling diodes and is terminated in 50 ohms with low parasitic capacitance. The input terminal 44 is coupled via a coaxial cable 46 to the control module 50 inserted into one of the bays 42 of the oscilloscope 30. The control module 50 is best shown in the perspective view of FIG. 3. The control module 50 has a coaxial input terminal 52, a coaxial output terminal 54, and a coaxial termination terminal 56. A dual contact input connector 58 is also provided in the control module. An optional visual indicator 60, such as an LED may be secured to the control module 50 to indicate when the probing tip of the measurement probe 40 is coupled to the sampling head 28. The coaxial input terminal 52 is coupled to one end of a coaxial cable 62 whose other end is coupled to the measurement probe 40. The coaxial output terminal 54 is coupled by the coaxial cable 46 to the input terminal 44 of the sampling head 28. A 50 ohm termination connector 66 is secured to the coaxial termination terminal 56. A dual contact connector 68 plugs into the input connector 58. At least one of the contacts 70 of the dual contact connector 68 is electrically connected to an electrical conductor 72 that is coupled to the measurement probe 40. The measurement probe 40 is used to probe circuit traces 22 and devices mounted on a circuit board 24 of a device under test 20.

Figure 4:
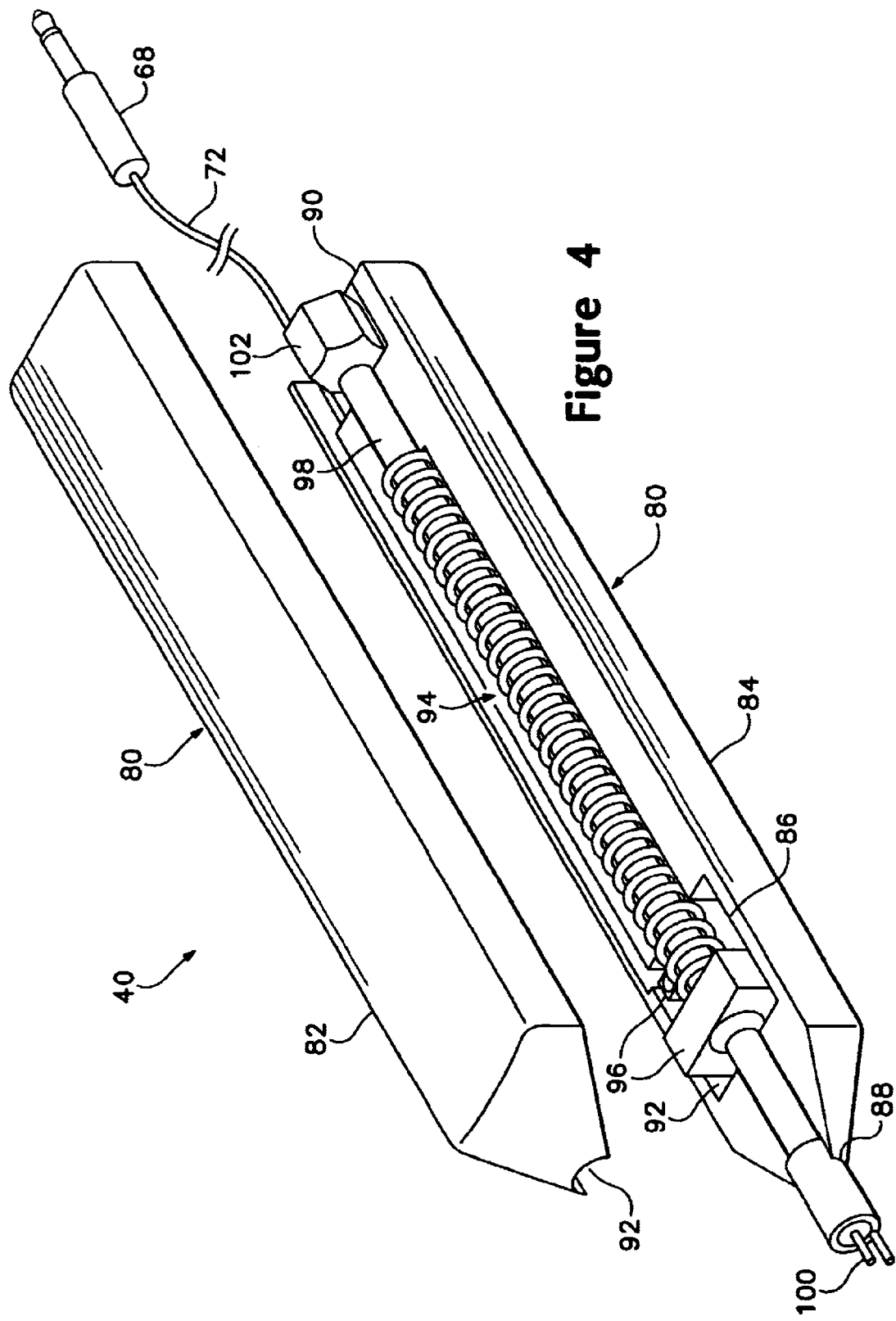
FIG. 4 is a partially exploded view of a first embodiment of the measurement probe providing EOS/ESD signal control according to the present invention.

Referring to FIG. 4, there is shown a partially exploded view of a first embodiment of the measurement probe 40 with EOS/ESD protection signal control. The measurement probe 40 has a preferably elongate, rectangular cross-section housing 80, which is preferably made of first and second members 82 and 84. The housing 80 is formed of an insulating material, such as ABS plastic, polycarbonate, or the like. Each housing member 82 and 84 has an interior channel 86 that is exposed at each end 88 and 90 of the housing members 82 and 84. Preferably the channels 86 are mirror images of each other and formed parallel to the longitudinal axis of each housing member 82 and 84. The channels 86 form an interior cavity 92 within the housing 80 when the first and second housing members 82 and 84 are attached to each other. Disposed within the interior cavity 92 are a spring loaded coaxial probe assembly 94 and a pressure sensor 96. The spring loaded coaxial probe assembly 94 has a semi-rigid coaxial cable 98 with one end formed as a probing tip 100 and the other end having a coaxial threaded connector 102. The coaxial probe assembly 94 is disposed in the channels 86 formed in the housing members 82 and 84 with the probing tip 100 extending from the one end 88 of the housing 80 and the coaxial threaded connector 102 extending from the other end 90 of the housing 80. The pressure sensor 96 is electrically coupled to the electrical conductor 72 having the mating dual contact connector 68.

Figure 5:
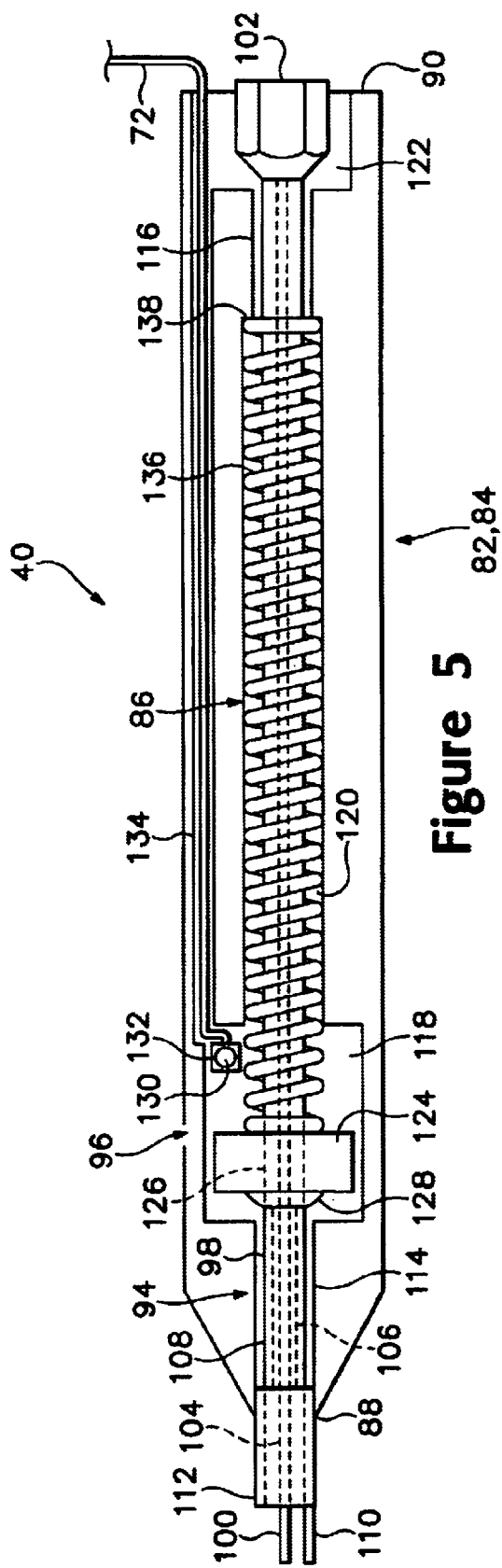
FIG. 5 is a plan view showing the elements of the first embodiment of the measurement probe providing EOS/ESD signal control according to the present invention.

FIG. 5 shows a plan view of one of the housing members 82 and 84 with the spring loaded coaxial probe assembly 94 and the pressure sensor 96 disposed in the housing member channel 86. Like elements from the previous drawing are labeled the same. The semi-rigid coaxial cable 98 has a central signal conductor 104 surrounded by an intermediate dielectric material 106, which in turn is surrounded by an outer shielding conductor 108. A portion of the dielectric material 106 and the outer shielding conductor 108 is removed from one end of the semi-rigid coaxial cable 98 to form the probing tip 100. A ground probing tip 110 is disposed adjacent to the probing tip 100 and is electrically coupled to the outer shielding conductor 108 of the semi-rigid coaxial cable 98. In the preferred embodiment the ground probing tip 110 is a retractable, spring loaded probing tip that is attached to a slotted collar 112 that fits around outer shielding conductor 108 of the semi-rigid coaxial cable 98.

The channel 86 is formed with various chambers that accept elements of the spring loaded coaxial probe assembly 94 and a pressure sensor 96. Chamber 114 of the channel 86 extend from the probing tip end 88 of the housing member 82 and is sized to closely fit the diameter of the semi-rigid coaxial cable 98. Abutting chamber 114 is a pressure sensor chamber 118 sized to accept the elements of the pressure sensor 96. Extending from the pressure sensor chamber 118 is a compression spring chamber 120 that extends to the chamber 116. Chamber 116 is sized to closely fit the diameter of the semi-rigid coaxial cable 98. Chambers 114 and 116 provide axial alignment of the spring loaded coaxial probe assembly 94 within the housing 80. Extending from the other end of chamber 116 is a connector chamber 122 that receives the coaxial threaded connector 102.

The pressure sensor 96 has a first electrically conductive contact 124 that is electrically coupled and secured to the outer shielding conductor 108 of the semi-rigid coaxial cable 98. The electrically conductive contact 124 preferably a gold plated rectangular block formed of copper and has a bore 126 formed therethrough for closely receiving the semi-rigid coaxial cable 98. The first electrically conductive contact 124 is positioned in the pressure sensor chamber 118 and secured to the semi-rigid coaxial cable using an adhesive 128, such as an epoxy, electrically conductive epoxy or the like. Besides functioning as part of the pressure sensor 96, the rectangular shaped conductive member 124 acts as an anti-rotation element for the coaxial probe assembly 94. Two of the flat surfaces of the rectangular shaped conductive member 124 engage the bottom surfaces of the respective pressure sensor chambers 118 in the housing members 82 and 84. The anti-rotation element allows the coaxial cable to be securing tightened to the threaded connector 102 of the spring loaded coaxial probe 94. A second electrically conductive contact 130 is positioned in the pressure sensor chamber 118 and secured to the housing member 82. The second electrically conductive contact 130 is preferably a square or rectangular shaped block formed of the same material as the first electrically conductive contact 124 and plated with a layer of gold. The square or rectangular block is preferably formed with a bore that accepts a threaded screw 132 for securing the second electrically conductive contact 130 to the housing member 82. Alternately, the second electrically conductive contact 130 may be secured in the housing member 82 use an adhesive, such as epoxy or the like. The electrical conductor 72, which in the preferred embodiment is an electrically conductive wire, is soldered to second electrically conductive contact 130 and positioned in a wire channel 134 that extends from the pressure sensor chamber 118 to the connector chamber 122.

A compression spring 136 surrounds the semi-rigid coaxial cable 98 and is positioned in the compression spring chamber 120. The compression spring 136 is held in place by a shoulder-138 formed at the interface between the compression, spring chamber 120 and the chamber 116 and a first electrically conductive contact 124.

Figure 6:
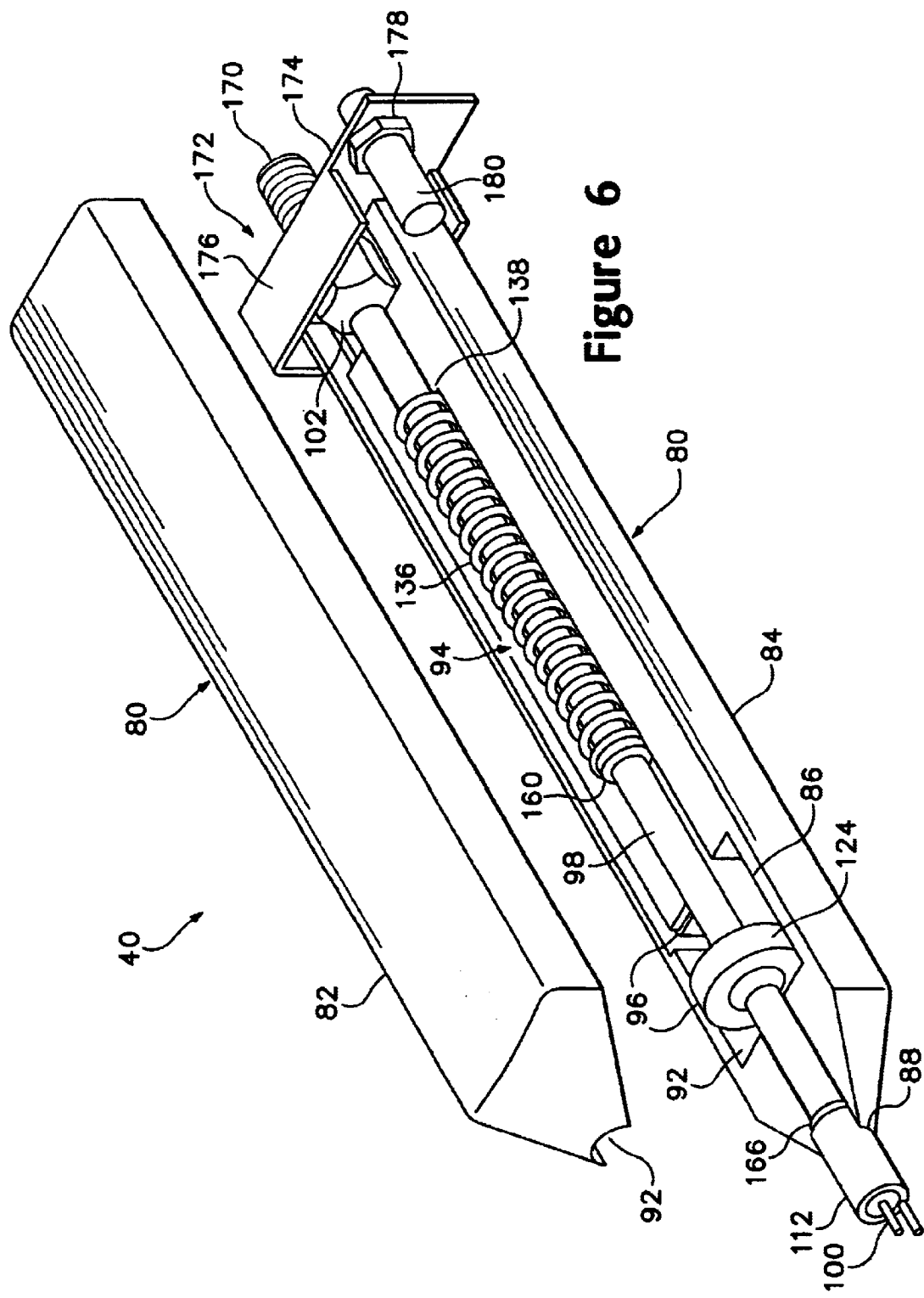
FIG. 6 is a partially exploded view of a second embodiment of the measurement probe providing EOS/ESD signal control according to the present invention.
Figure 7:
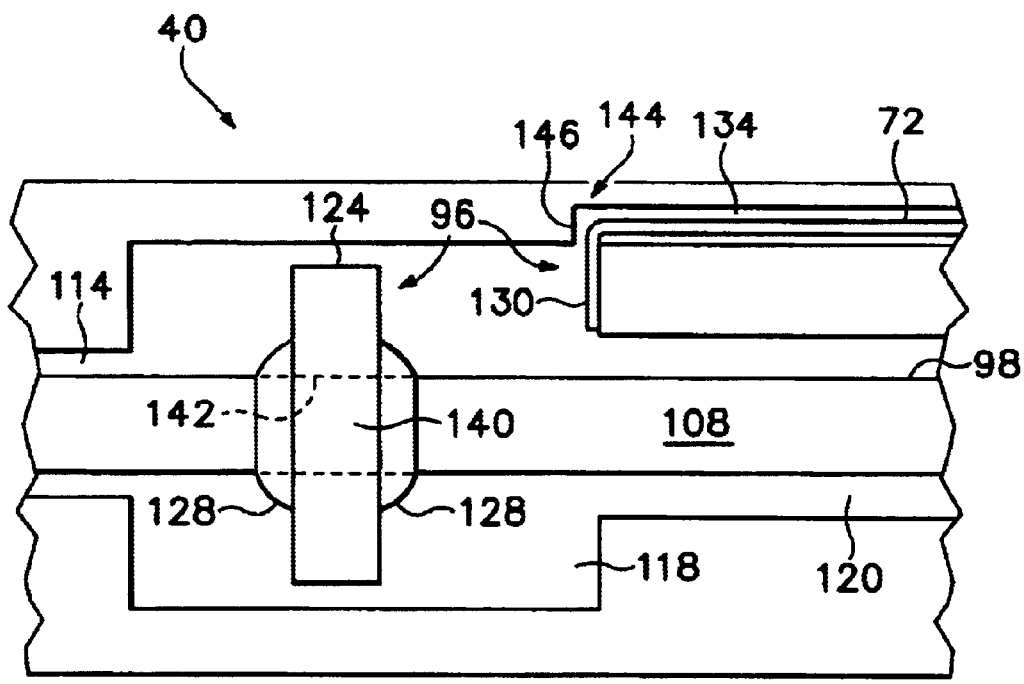
FIG. 7 is a plan view of the pressure sensor chamber showing an alternative embodiment of the pressure sensor in the measurement probe providing EOS/ESD signal control according to the present invention.

FIG. 6 shows a perspective view of a further embodiment of the measurement probe 40. Like elements from the previous drawings are labeled the same. The pressure sensor 96 is modified to include a disk 140 having a centrally disposed bore 142 therethrough functioning as the first electrically conductive contact 124 as shown in the plan view of the pressure sensor chamber area of FIG. 7. The disk 140 may be substantially circular, oval shaped or the like. The disk 140 is positioned in the pressure sensor chamber 118 and the semi-rigid coaxial cable 98 is closely received in the bore 142 of the disk 140 with the disk 140 being electrically coupled and secured to the outer shielding conductor 108 of the semi-rigid coaxial cable 98 using an adhesive 128, such as an epoxy, electrically conductive epoxy or the like. The disk 140 is formed of a conductive material, such as copper or the like that is plated with a layer of gold. The second electrically conductive contact 130 of the pressure sensor 96 is formed from the end of the electrically conductive wire 72. The end of the wire 72 is plated and routed in the wire channel 134 to the pressure sensor chamber 118. The end of the wire channel 134 has a substantially ninety degree bend 144 to extend to the channel to the pressure sensor chamber 118. The plated end of the wire 72 is routed through the ninety degree bend 144 in the wire channel 134 and exposed in the pressure sensor chamber 118. The end wall 146 at the bend 144 in the wire channel 134 and the bending of the electrically conductive wire 72 retains the end of the electrically conductive wire 72 in the pressure sensor chamber 118. Alternately, electrically conductive wire 72 within the wire channel 134 may be formed from two different wire gages. The electrically conductive wire 72 extending from the measurement probe is formed from a flexible thinner gage wire material and the electrically conductive wire extending into the pressure sensor cavity 118 is formed from a thicker non-flexible gage wire material. The two different wire gages are inserted into an aperture 135 formed in the wire channel 134 and electrically connected using solder, an electrically conductive adhesive or the like.

Figure 8:
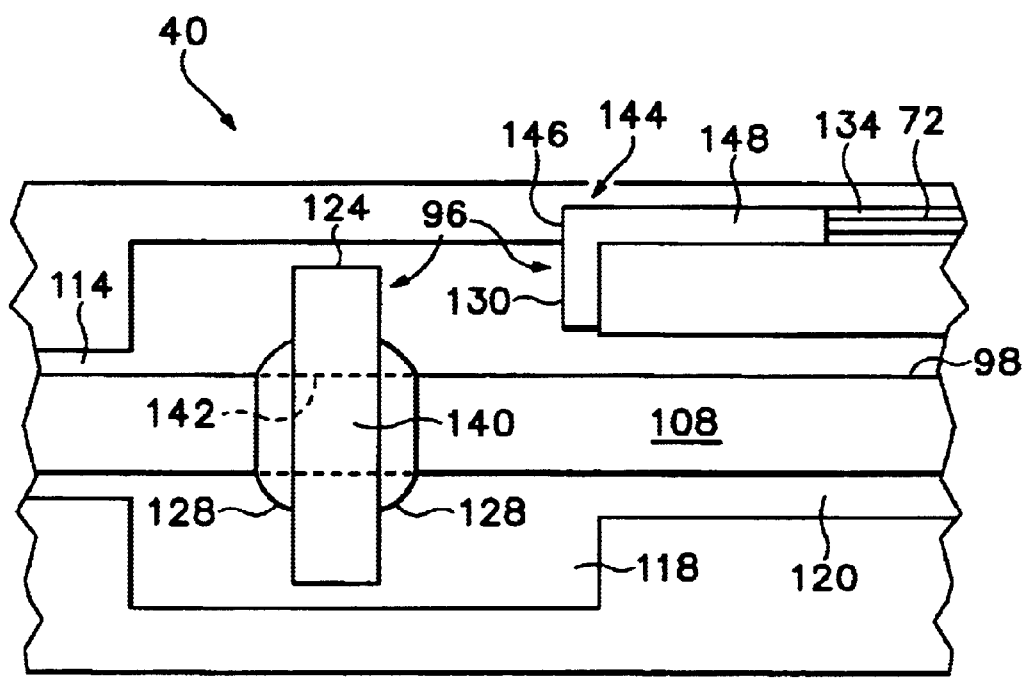
FIG. 8 is a plan view of the pressure sensor chamber area showing an another embodiment of the pressure sensor in the measurement probe providing EOS/ESD signal control according to the present invention.

FIG. 8 is a the plan view of the pressure sensor chamber area showing another embodiment of the pressure sensor 96. Like elements from the previous drawing are labeled the same. The first electrically conductive contact 124 is the disk 140 secured to the outer shielding conductor 108 of the semi-rigid coaxial cable 98. The second electrically conductive contact 130 of the pressure sensor 96 is a substantially L-shaped conductor 148 electrically coupled to the electrically conductive wire 72, such as by soldering or the like. The L-shaped conductor 148 is preferably made of a flat metal stock that is plated with a layer of gold. One end of the L-shaped conductor 148 is positioned in an enlarged end portion of the wire channel 134 that includes the bend 144. The other end of the L-shaped conductor 148 extends into pressure sensor chamber 118. The end wall 146 at the bend 144 retains the L-shaped conductor 48 in the enlarged wire channel 134.

Figure 9:
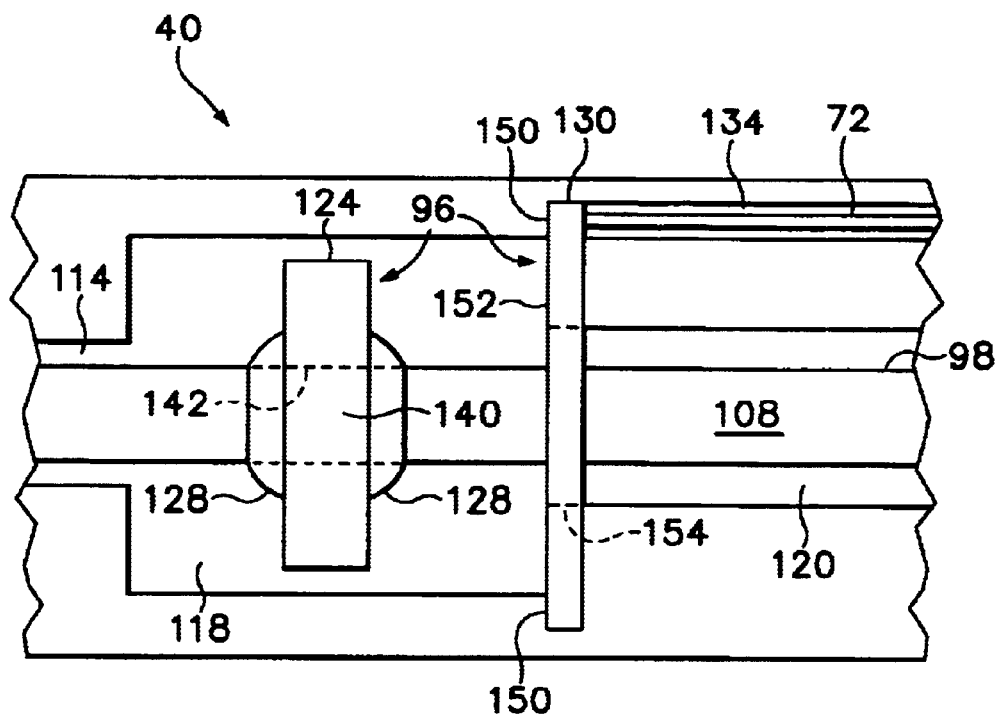
FIG. 9 is a plan view of the pressure sensor chamber area showing a further embodiment of the pressure sensor in the measurement probe providing EOS/ESD signal control according to the present invention.

FIG. 9 is a plan view of the pressure sensor chamber area showing a further embodiment of the pressure sensor 96. Like elements from the previous drawing are labeled the same. The first electrically conductive contact 124 is the disk 140 secured to the outer shielding conductor 108 of the semi-rigid coaxial cable 98. Notches 150 are formed in the outer walls of the pressure sensor chamber 118 adjacent to the compression spring chamber 120 for receiving an electrically conductive element 152 having a bore 154 therethrough functioning as the second electrically conductive contact 130. The bore 154 is of sufficient size to allow the semi-rigid coaxial cable 98 to pass through the electrically conductive element 152 without contacting the element 152. The electrically conductive element 152 is preferably made of metal, such as copper, and plated with a layer of gold. The electrically conductive element 152 is preferably circular in form but other shapes, such as rectangular, oval, and the like may be used. The electrically conductive wire 72 is electrically coupled to the electrically conductive element 152, such as by soldering or the like.

Figure 10:
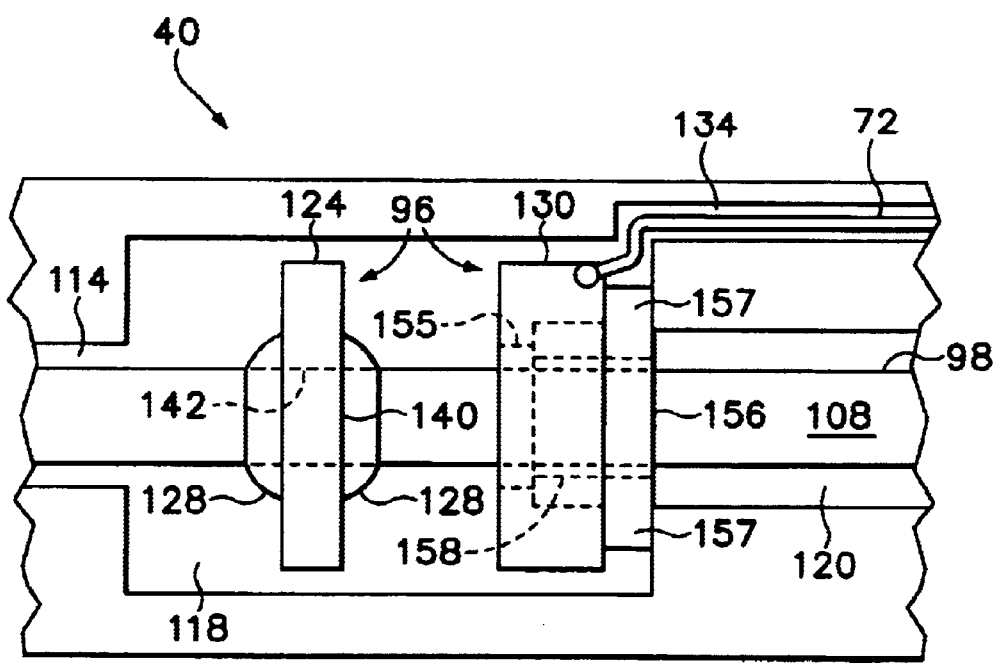
FIG. 10 is a plan view of the pressure sensor chamber showing a further embodiment of the pressure sensor in the measurement probe providing EOS/ESD signal control according to the present invention.

FIG. 10 is a the plan view of the pressure sensor chamber area showing an additional embodiment of the pressure sensor 96. Like elements from the previous drawing are labeled the same. The first electrically conductive contact 124 is the disk 140 secured to the outer shielding conductor 108 of the semi-rigid coaxial cable 98. The second electrically conductive contact 130 has a bore 155 therethrough for receiving an electrically insulating bushing 156. One end of the second electrically conductive element 130 extends past the end of the bushing 156 and the other end abuts a flange 157 formed at the opposite end of the bushing. The bushing 156 has a bore 158 therethrough that allows for the free movement of the semi-rigid coaxial cable 98 through the bushing. The bushing flange 159 abuts the end wall of the pressure sensor chamber 118 adjacent to the compression spring chamber 120. The bushing 156 is secured to the end wall of the pressure sensor chamber using an adhesive, such as an epoxy or the like. The second electrically conductive contact 130 is preferably made of metal, such as copper, and plated with a layer of gold. The second electrically conductive contact 130 is preferably circular in form but other shapes, such as rectangular, oval, and the like may be used. The electrically conductive wire 72 is electrically coupled to the electrically conductive contact 130, such as by soldering or the like.

Referring back to FIG. 6, the compression spring 134 is preferably held in place by a compression spring retention member 160 secured to outer shielding conductor 108 of the semi-rigid coaxial cable 98 and the shoulder 136 formed at the interface between the compression spring chamber 120 and the chamber 116. The compression spring retention member 160, as best shown in FIG. 11, has a transverse notch 162 formed in the outer shielding conductor 108 of the semi-rigid coaxial cable 98. The transverse notch 162 may be formed using a file, hand-held electric grinder, or the like.

A wire 164 wraps around the semi-rigid coaxial cable 98 in an overlapping manner and engages the transverse notch 162. The overlapping portion of the wire are soldered together. The same compression spring retention member 60 structure may be used as a ground probing tip stop 166 to prevent the ground probing tip collar 112 from axially sliding on the semi-rigid coaxial cable 98.

A female-to-female coaxial adapter 170 is threadably secured to the coaxial threaded connector 102 for attaching the coaxial cable 62 to the measurement probe 40. A bracket 172 having a top plate 174 with at least a first aperture therein receives the female-to-female adapter 170. Threaded nuts secure the bracket 172 to the adapter 170. Sidewalls 176 depend from at least two sides of the top plate 174 and extend down along the exterior sides of the housing 80. At least one of the side surfaces of each of the sidewalls are disposed inward of the planar surfaces of the housing. The bracket 172 functions as an anti-rotation element for the coaxial probe assembly 94 instead of the rectangular block shaped first electrically conductive contact 124 of the pressure sensor 96. The bracket 172 may be formed with three depending sidewalls forming a three sided cavity that fits over the end of the housing 80. Alternately, the bracket 172 may have a single sidewall 176 where the side surfaces of the sidewall disposed inward of the planar surface of the housing 80. The top plate 174 may extend outward past the housing 80 and have a second aperture 178 formed therein for receiving an electrical connector 180 associated with the electrically conductive wire 72.

Referring to FIG. 12, there is shown a plan view of the housing member 84 with the measurement probe elements in the embodiment of the measurement probe 40 in FIG. 6. Like elements from the previous drawings are labeled the same. A nut 182 is threaded onto the female-to-female adapter 170 and the bracket 172 is positioned against the nut 182. A lock washer (not shown) and a second nut 184 is threaded onto the adapter 170 and tightened against the bracket 172 to secure the bracket to the adapter 170. The electrical connector 180 has a externally threaded upper portion 186 terminating in a flange 188 partway down the connector 180. The electrical connector 180 is inserted through the aperture 178 formed in the bracket 172 with the flange 188 abutting the bracket. The threaded upper portion 186 extends above the bracket and receives a nut 190 which is tightened against the bracket 172 to secure the electrical connector 180 to the bracket. The electrically conductive wire 72 of the first embodiment is segmented into first and second electrically conductive wires 192 and 194. The first segment wire 192 electrically couples the second electrically conductive contact 130 of the pressure sensor 96 to an electrical contact of the electrical connector 180 mounted on the bracket 172. The second segment wire 194 includes an electrical connector plug 196 having an electrical contact that mates with the electrical contact of the electrical connector 180 and electrically couples the pressure sensor 96 to the control module 50 via the a dual contact connector 68 that plugs into the input connector 58.

Referring to FIG. 13, there is shown an alternative structure for the housing 80 of the measurement probe 40. A flange 200 extends rearward past the end 90 of each of the housing member 82 and 84. The bracket 172, attached to the female-to-female adapter 170, is modified by removing the depending sidewalls 176 and is disposed between the opposing flanges. The side surfaces of the bracket are disposed adjacent to the flanges. The flanges 200 functions as an anti-rotation element for the coaxial probe assembly 94 instead of the depending sidewalls 176 or the rectangular block shaped first electrically conductive contact 124 of the pressure sensor 96.

Figure 14:
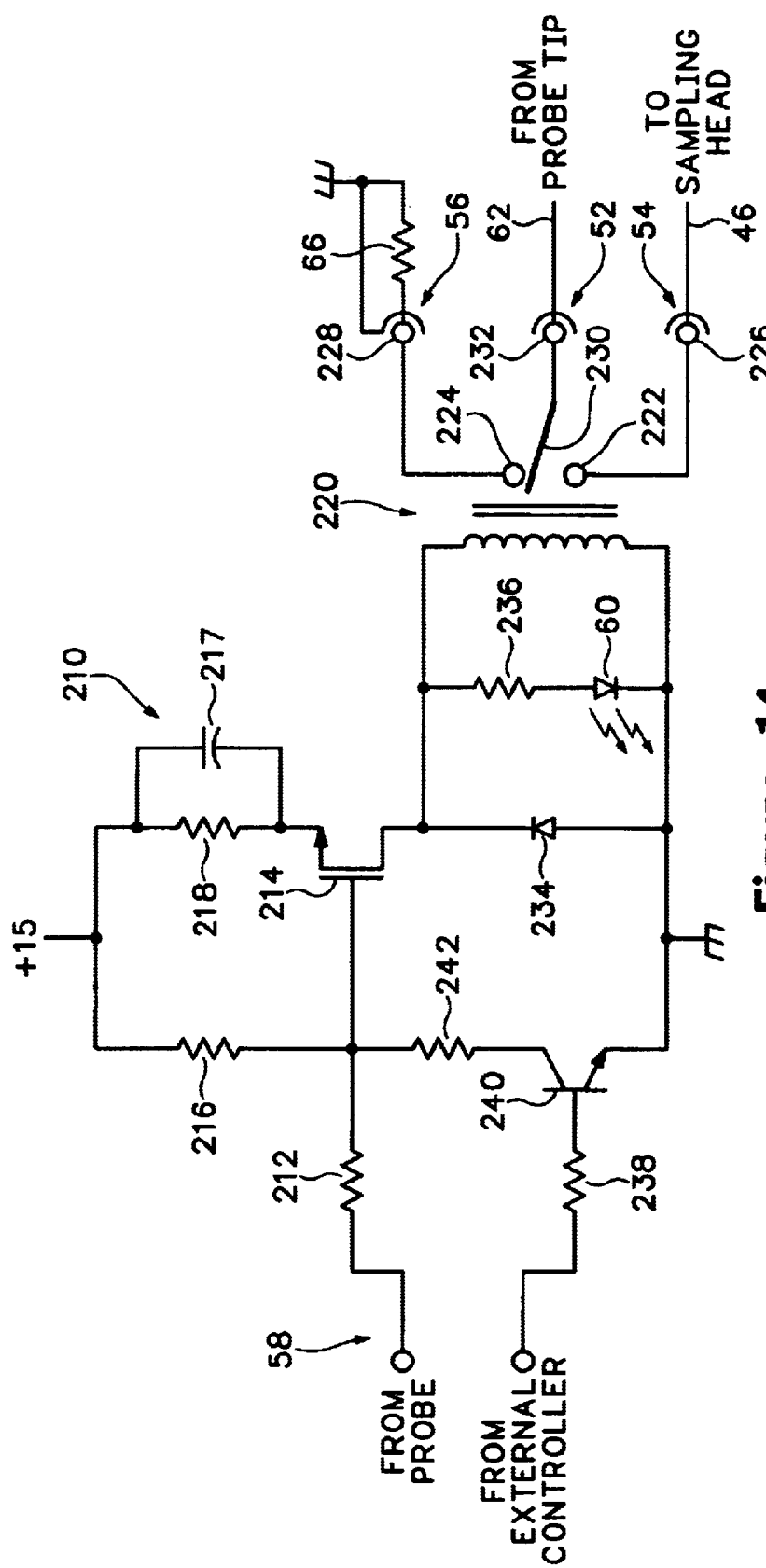
FIG. 14 is a representative schematic representation of the control circuitry in the control module coupled to the measurement probe providing EOS/ESD signal control according to the present invention.

Referring to FIG. 14, there is shown a schematic representation of control circuitry 210 in the control module 50 that provides EOS/ESD protection to the sampling head 28 of the measurement test instrument 30 in the measurement probing system 38. The dual contact signal connector 58 has one contact electrically coupled to the pressure sensor 96 of the measurement probe 40 and the other contact electrically coupled to an external controller. The contact coupled to the pressure sensor 96 provides a resistive activation signal to the control circuitry 210 and a contact coupled to the external controller provides a TTL logic activation signal to the control circuitry 210. The activation signal from the measurement probe 40 is coupled through resistor 212 to the control terminal of a high input impedance transconductance device 214. In the preferred embodiment, the high input impedance transconductance device 214 is a p-channel MOS field effect transistor, such as manufactured and sold by Tektronix, Inc. under Part No. 151-1120-00. Alternately, the high input impedance transconductance device 214 may be a CMOS logic gate controlling a power circuit. A bias resistor 216 is coupled between the control terminal of the high input impedance transconductance device 214 and a voltage supply. The voltage supply is also supplied to the current output of the high input impedance transconductance device 214 through power supply resistor 218 and charging capacitor 217. The output of the high input impedance transconductance device 214 is coupled through a RF relay switch 220. Relay switch contacts 222 and 224 are respectively coupled to the signal conductors 226 and 228 of the coaxial output terminal 54 and a coaxial termination terminal 56. The armature contact 230 is coupled to the signal conductor 232 of the coaxial input terminal 52. A shunt diode 234 is coupled in parallel with the RF relay switch 216. A series connected resistor 236 and light emitting diode used as the optional visual indicator 60 may be coupled in parallel with the RF relay switch 216. The other contact of dual contact signal connector 58 is coupled through resistor 238 to the base of drive transistor 240. The collector of drive transistor 240 is coupled through load resistor 242 to the input of the high input impedance transconductance device 214.

The operation of the measurement probe will be described with a p-channel MOSFET as the high input impedance transconductance device 214. The spring loaded coaxial probe assembly 94 of the measurement probe 40 is coupled to the coaxial input terminal 52 of the control module 50 via coaxial cable 62. The central signal conductor 104 of the semi-rigid coaxial cable 98 is coupled to the signal conductor 232 of the coaxial input terminal 52 and the outer shielding conductor 108 is coupled to electrical ground through the outer shielding conductor of the coaxial cable 62 and the coaxial input terminal 52. The pressure sensor 96 is coupled to the input of the p-channel MOSFET 214 via the electrical conductor 72 and one of the contacts of the dual contact input connector 58. The pressure sensor 96 functions as a switch element for the input circuitry of the p-channel MOSFET 214. The pressure sensor 96 presents an open circuit to the gate of the p-channelMOSFET in the standby mode. The open circuit biases the p-channel MOSFET 214 to the off state by coupling supply voltage through the biasing resistor 216 to the gate of the MOSFET.

An operator positions the measurement probe 40 is on the device under test 20 with the probing tip 100 contacting the circuit traces 22. The probing tip 100 is coupled to electrical ground through the armature and switch contacts 230 and 224 and the 50 ohm termination resistor 66 to discharge any ESD and EOS voltages on the device under test 20. Pressure applied to the probing tip 100 of the measurement probe 40 in contact with a device under test 20 causes the housing 80 to move from its first position to a second position relative to the spring loaded coaxial probe assembly. The movement of the housing 80 brings the second electrically conductive contact 130 of the pressure sensor 96 into contact with the first electrically conductive contact 124 of the pressure sensor 96. The engagement of the first and second electrically conductive contacts 124 and 130 couples electrical ground into the input circuitry of the p-channel MOSFET 214 producing a voltage divider network that includes biasing resistor 216, input resistor 212 and the resistance of the pressure sensor 96. The voltage drop across biasing resistor 216, which in the preferred embodiment has a high resistive value of approximately 4.7 megohms, causes the p-channel MOSFET 214 to conduct and apply a pull-in current and voltage to the coil of the RF relay 220 that closes the contacts 230 and 222 and couple the probing tip 100 of the measurement probe 40 to the input of the sampling head 28. The RF relay 220 requires a 30 ma pull-in current at +15 volts to initially move the armature 230 from the normally closed contact 224 to the normally open contact 222. A smaller holding current and voltage is supplied to the RF relay 220 by the RC circuit made of charging capacitor 217 and resistor 218. The current output of the p-channel MOSFET is also coupled through resistor 236 and LED 60 to provide a visual indication that the probing tip is coupled to the input of sampling head 28.

Lifting the measurement probe 40 off of the device under test 20 disengages the electrically conductive contacts 124 and 130 of the pressure sensor 96 causing the activation signal from the measurement probe to be removed from the input circuit of the p-channel MOSFET. The voltage supply is reapplied to the gate of the p-channel MOSFET causing the MOSFET to shut off and remove the power to the RF coil 220, which in turn couples the probing tip 100 of the measurement probe 40 to electrical ground through the 50 ohm termination resistor 66. The current from the collapsing magnetic field of the coil is coupled through shunt capacitor 234.

The measurement probe 40 may be used with an automated measurement system where the measurement probe 40 is mounted in a test fixture that moves the probe from test point to test point on the device under test under computer control. A separate electrical conductor 72 couples the computer controlled test system via the other one of the contacts of the dual contact input connector 58 to the base of the drive transistor 240. The computer controlled test system provides a TTL high logic activation signal to the drive transistor 240 causing the transistor to conduct. The voltage on the gate of the p-channel MOSFET 214 decreases in response to the current through the voltage divider network of resistor 216 and 242 causing the p-channel MOSFET to conduct and energizing the RF relay 220 and couple the probing tip 100 of the measurement probe 40 to the input of the sampling head 28. Removing the TTL logic high activation signal from the base of the drive transistor 240 causes the transistor to shut off and reapply the supply voltage to the gate of the p-channel MOSFET 214 causing the p-channel MOSFET to shut off, which in turn couples the probing tip 100 of the measurement probe 40 to electrical ground through the 50 ohm termination resistor 66.

The measurement probe 40 of the present invention incorporates a low precision resistance pressure sensor 96 that can generate a legal engage activation signal with the a contact resistance as high as tens of kilo ohms. This is in contrast to the prior art isolation unit that requires a precision low resistive switch having a typical contact resistance in tens of milliohms. The pressure sensor 96 operates in response to the relative movement of the spring loaded coaxial probe assembly 94 and the housing 80 to provide the activation signal to the control circuitry 210 in the control module 50. The contacts 124 and 130 are compact and inexpensive components that are readily fixable to the spring loaded coaxial probe assembly 94 and the housing 80 of the measurement probe 40.

The control module 50 is preferably designed to fit into the bay 42 of the measurement test instrument 30. The control module 50 may be modified to operate with a power adapter 16 that provides DC power from a standard electrical outlet.

A measurement probe has been described having a housing in which are disposed a spring loaded coaxial probe assembly and a pressure sensor. The probe assembly is formed from a semi-rigid coaxial cable having a probing tip formed at one end and a coaxial connector at the other end. The pressure sensor has first. electrically conductive contact secured and electrically coupled to the semi-rigid coaxial. cable and a second electrically conductive contact positioned and secured within the internal cavity of the housing. The probing tip is coupled to electrical ground via a control module when the housing is in a first position and the probing tip is coupled to the input circuitry of the measurement test instrument via the control module in response to an activation signal generated by the pressure sensor in response to movement of the housing to a second position and coupled to the control module.

It will be obvious to those having skill in the art that many changes may be made to the details of the above-described embodiments of this invention without departing from the underlying principles thereof. The scope of the present invention should, therefore, be determined only by the following claims.

What is claimed is:

1. A measurement probe coupled via a coaxial cable to an electrical over stress and electrostatic discharge protection module and proving signal control to the electrical over stress and electrostatic discharge protection module for coupling the measurement probe to input circuitry of the measurement test instrument comprising:

a spring loaded coaxial probe assembly formed from a semi-rigid coaxial-cable having a probing tip at one end and a threaded connector at the other end and a compression spring positioned on the semi-rigid coaxial cable with the threaded connector being coupled to the coaxial cable;

a housing having an internal cavity extending the length of the housing and exposed at opposing ends of the housing with the spring loaded coaxial probe assembly disposed within the internal cavity having the probing tip extending from one end of the housing and the threaded connector extending from the other end of the housing with the housing movable from a first position to a second position relative to the spring loaded coaxial probe assembly from pressure applied to the probing tip of the measurement probe in contact with a device under test; and a pressure sensor having a first electrically conductive contact secured and electrically coupled to an outer shielding conductor of the semi-rigid coaxial cable and a second electrically conductive contact positioned and secured within the internal cavity of the housing with the second electrically conductive contact coupled to the control module via an electrical conductor;

the probing tip coupled to electrical ground via the control module when the housing is in the first position and the control module responsive to an activation signal generated by the first and second electrically conductive contacts of the pressure sensor contacting each other by movement of the housing to the second position to couple the probing tip to the input circuitry of the measurement test instrument.

2. The measurement probe as recited in claim 1 wherein the housing further comprises first and second members with each member having a channel formed therein for receiving the spring loaded coaxial probe assembly and the pressure sensor with the first and second members being joined together such that the channels form the internal cavity.

3. The measurement probe as recited in claim 1 wherein the electrical conductor further comprises first and second insulated wire segments with the first wire segment electrically coupling the second electrically conductive contact of the pressure sensor to an electrical contact of an electrical connector receptacle mounted on the measurement probe and the second insulated wire segment electrically coupling an electrical contact of a first electrical plug to an electrical contact of a second electrical plug with the first electrical plug mating with the electrical connector receptacle mounted on the measurement probe and the second electrical plug mating with an electrical connector receptacle having at least a first electrical contact mounted in the control module.

4. The measurement probe as recited in claim 1 wherein the compression spring abuts the first electrically conductive contact of the pressure sensor and the other end abuts a shoulder extending into the interior cavity.

5. The measurement probe as recited in claim 1 further comprising the housing having opposing anti-rotation flanges extending rearward from the housing and a bracket having a top plate with side surfaces secured to the threaded connector with the side surfaces of the top plate disposed adjacent to the anti-rotation flanges.

6. The measurement probe as recited in claim 1 wherein the compression spring abuts a spring retention member secured to the semi-rigid coaxial cable and the other end abuts a shoulder extending into the interior cavity.

7. The measurement probe as recited in claim 6 wherein the spring retention member comprises a transverse notch formed in the outer shielding conductor of the semi-rigid coaxial cable and a wire wrapped around the semi-rigid coaxial cable in an overlapping manner and engaging the transverse notch with the overlapping portion of the wire being soldered together.

8. The measurement probe as recited in claim 1 further comprising the housing having at least a first planar surface and an anti-rotation bracket having a top plate and at least a first sidewall having opposing side surfaces depending from the top plate with the anti-rotation bracket secured to the threaded connector and the sidewall extending along the planar surface of the housing with the side surfaces disposed inward of the planar surface of the housing.

9. The measurement probe as recited in claim 8 further comprising the housing having opposing planar surfaces and an anti-rotation bracket having a top plate and opposing sidewalls with each sidewall having opposing side surfaces depending from the top plate with the anti-rotation bracket secured to the threaded connector and the opposing sidewalls extending along the opposing planar surfaces of the housing with at least one side surfaces of each of the sidewalls disposed inward of the planar surfaces of the housing.

10. The measurement probe as recited in claim 1 wherein the internal cavity further comprises a pressure sensor chamber having the first and second electrically conductive contacts of the pressure sensor disposed therein.

11. The measurement probe as recited in claim 10 wherein the first electrically conductive contact of the pressure sensor comprises a rectangular block of electrically conductive material having a bore formed therethrough for receiving the semi-rigid coaxial cable.

12. The measurement probe as recited in claim 10 wherein the first electrically conductive contact of the pressure sensor comprises a disk of electrically conductive material having a bore formed therethrough for receiving the semi-rigid coaxial cable.

13. The measurement probe as recited in claim 10 further comprising an electrical conductor channel formed in the housing with one end of the electrical conductor channel extending to a pressure sensor chamber of the internal cavity and the other end extending to the threaded connector end of the housing for receiving the electrical conductor.

14. The measurement probe as recited in claim 6 wherein the second electrically conductive contact of the pressure sensor comprises a block of electrically conductive material.

15. The measurement probe as recited in claim 6 wherein the second electrically conductive contact comprises a flat conductor having a first portion exposed in the pressure sensor cavity and a second portion disposed within the electrical conductor channel.

16. The measurement probe as recited in claim 13 wherein the second electrically conductive contact comprises a flat electrically conductive disk positioned in notches formed in the pressure sensor, the flat electrically conductive disk having an oversized bore therethrough that allows for the free movement of the semi-rigid coaxial cable through the flat electrically conductive disk.

17. The measurement probe as recited in claim 13 wherein the second electrically conductive contact has a bore therethrough for closely receiving an insulating bushing with one end of the second electrically conductive contact extending past one end of the insulating bushing and the other end abutting an outwardly extending flange formed at the other end of the insulating bushing with the flange secured to the housing, the insulating bushing having an oversized bore formed therethrough that allows for the free movement of the semi-rigid coaxial cable through the bushing.

18. The measurement probe as recited in claim 13 wherein the electrical conductor is an insulated electrical wire.

19. The measurement probe as recited in claim 18 wherein the second electrically conductive contact of the pressure sensor comprises an end portion of the insulated electrical wire extending into the pressure sensor chamber with the insulation on the end portion removed to expose the electrical wire.

* * * * *